United States Patent [19]

Bright

[11] Patent Number: 4,744,140
[45] Date of Patent: May 17, 1988

[54] ALIGNMENT AND INSERTION TOOL FOR CONNECTORS

[75] Inventor: Edward J. Bright, Elizabethtown, Pa.

[73] Assignee: AMP Incorporated, Harrisburg, Pa.

[21] Appl. No.: 444,404

[22] Filed: Nov. 26, 1982

[51] Int. Cl.[4] .............................................. H05K 3/30
[52] U.S. Cl. ...................................... 29/741; 29/271; 29/739; 29/758; 29/845
[58] Field of Search ................. 29/739, 741, 758, 759, 29/834–839, 747, 271–274

[56] References Cited

U.S. PATENT DOCUMENTS

| | | | |
|---|---|---|---|
| 2,871,547 | 2/1959 | Huggins, Jr. .......................... | 29/834 |
| 2,871,548 | 2/1959 | Pisani .................................... | 29/834 |
| 3,102,447 | 9/1963 | Gregory et al. .................. | 29/271 X |
| 3,401,548 | 9/1968 | Ross et al. ......................... | 29/758 X |
| 3,646,399 | 2/1972 | Mars et al. ........................ | 29/834 X |

Primary Examiner—Carl E. Hall
Attorney, Agent, or Firm—Allan B. Osborne

[57] ABSTRACT

A tool for mounting connectors onto a printed circuit board. More particularly, the tool includes a pair of pins mounted in a holder. A connector is placed on the tool with the pins passing through holes therein. Thereafter, the connector leads are accurately piloted into plated through holes in the PCB by the pins being inserted into aligned holes in the board.

1 Claim, 1 Drawing Sheet

U.S. Patent   May 17, 1988   4,744,140
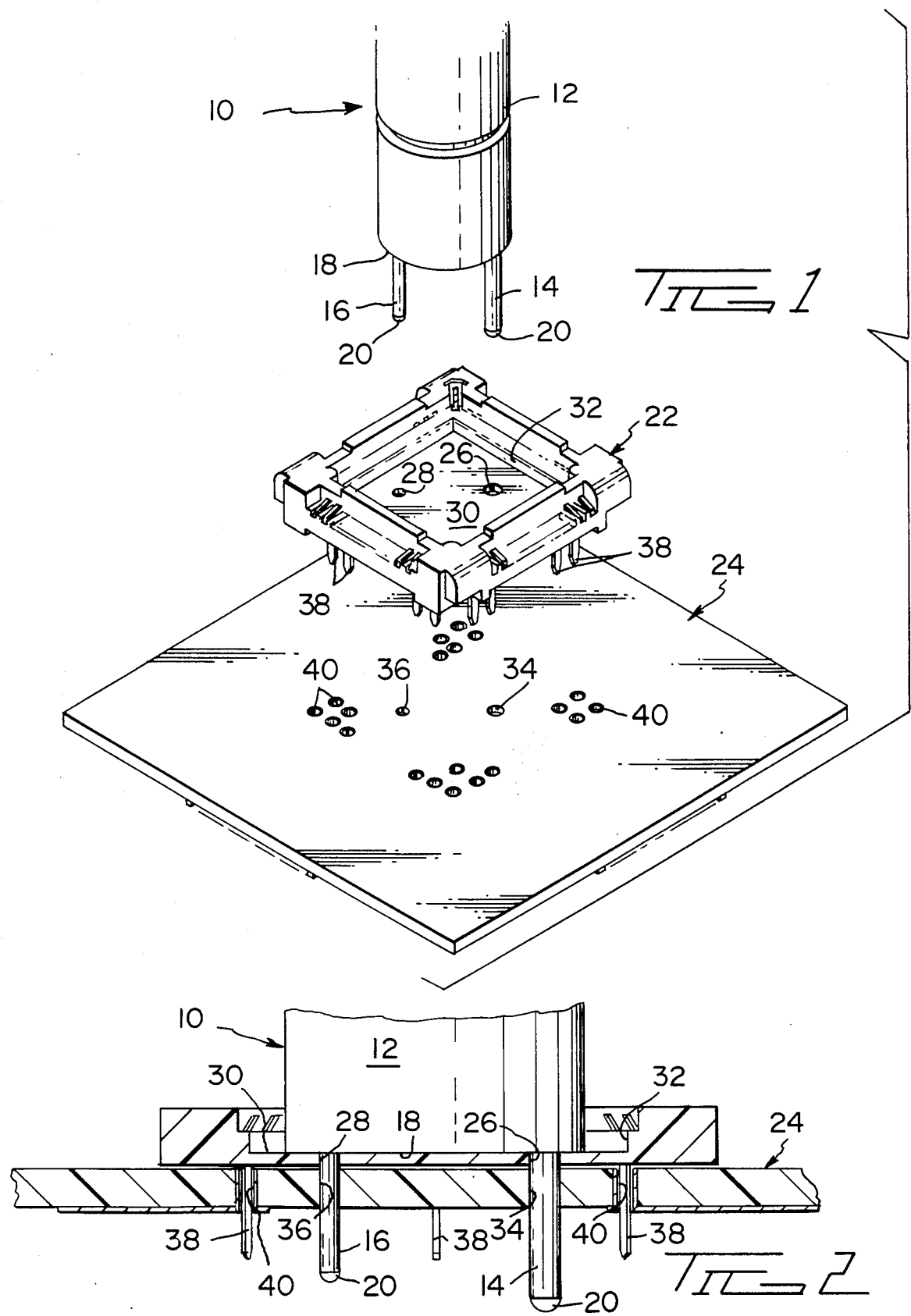

ALIGNMENT AND INSERTION TOOL FOR CONNECTORS

BACKGROUND OF THE INVENTION

1. Field of the Invention

The invention disclosed herein relates to tools for mounting connectors of the type having depending leads onto printed circuit boards where the leads are received into plated through holes in the board.

2. Prior Art

Connectors are mounted onto a circuit board by hand so that the leads depending from the connector can be carefully inserted into plated through holes. One company, AMP Incorporated of Harrisburg, Pennsylvania, and the assignee of the present application, pioneered the use of a mylar strip having precisely-located holes into which the leads are partially inserted. The mylar strip holds the leads in precise alignment so that they may be inserted into the holes in the circuit board without bending or otherwise damaging them. As the connector is pushed down onto the board, the mylar strip slides up the leads, remaining between the board surface and connector underside.

SUMMARY OF THE INVENTION

The invention disclosed and claimed herein comprises a tool which includes two pins extending from one end of a handle in a precise, predetermined pattern which is repeated in the form of pin-receiving holes in a circuit board connector and in the circuit board. The connector is loaded onto the tool so that the pins extend below the connector leads. Upon insertion of the pins into the holes of the board, the connector leads are precisely piloted into lead-receiving holes in the board.

BRIEF DESCRIPTION OF THE DRAWINGS

FIG. 1 is an isometric view of the tool constructed in accordance with the present invention, and shown with a circuit board and a connector to be mounted thereon with the tool; and FIG. 2 is a sectioned view showing the connector being mounted on the board with the tool of FIG. 1.

DESCRIPTION OF THE INVENTION

Tool 10, constructed in accordance with the present invention, includes handle 12 and two pins, 14 and 16, extending from end 18 thereof. Handle 12 is preferrably molded from an insulating material; e.g., nylon, and may be hand-held or adapted for use in automatic assembly equipment (not shown). Pins 14 and 16 are preferrably made from a rigid material; e.g., stainless steel, and have rounded tips 20. One pin has a larger diameter (pin 14) than the other (pin 16). The two pins are precisely mounted or fixed in end 18 of the handle in a predetermined pattern or spacing.

Tool 10 is useful with connectors and circuit boards having pin-receiving holes in the same pattern as pins 14 and 16. Connector 22 and circuit board 24, shown in the drawings, have such holes. With respect to connector 22, holes 26 and 28 are precisely located in and through floor 30 of central compartment 32. Hole 26, being of a large diameter, accepts pin 14 while hole 28, being smaller, accepts pin 16. It is obvious that connector 22 can be mounted on the pins on tool 10 in just one orientation.

Circuit board 24 is also provided with identically sized and precisely located holes 34 and 36, the former to receive pin 14 and the latter to receive pin 16. These holes are in precise alignment with holes 26 and 28.

Connector 22 is mounted on board 24 by depending leads 38 being inserted into plated through holes 40 in the board. Leads 38 are relatively small and easily bent. Accordingly, considerable care must be taken while inserting them into the holes. This is simply and accurately accomplished by using tool 10 in the manner set forth below.

First, connector 22 is mounted on tool 10 by pins 14 and 16 entering holes 26 and 28 respectively. The connector is slid up the pins until end 18 on handle 12 abuts floor 30. Thus, the pins will extend well beyond leads 38. The next step is to align pins 14 and 16 with holes 34 and 36 in board 24. Then, upon pushing on the tool handle, the pins will enter those holes and leads 38 will be piloted precisely into holes 40. FIG. 2 shows the connector mounted on the board with tool 10 still in position. After the leads are fully inserted, tool 10 is simply withdrawn from the board and connector.

With two, elongated pins of rigid material such as shown and described, the tool will be vertical in order to push the pins into holes 34 and 36. Accordingly, the leads will enter holes 40 vertically and cannot be damaged.

More than two pins can be employed but two are completely sufficient to achieve rapid and accurate connector mounting.

The pattern of pins 14 and 16 and corresponding holes 26, 28, 34 and 36 is based on available space and other like parameters. The two pins should be spaced one from the other an appreciable distance to provide firm support for the connector.

One pin may be longer than the other as shown in the drawings with the longer one providing initial general alignment. The two pins, of course, provide, in cooperation, correct angular alignment.

In addition to mounting a connector on a board, the tool automatically mounts the connector in the correct orientation.

The foregoing detailed description has been given for clearness of understanding only, and no unnecessary limitations should be understood therefrom, as some modifications will be obvious to those skilled in the art.

I claim:

1. An alignment and insertion tool for mounting connectors having depending leads onto printed circuit boards having lead-receiving holes, said tool comprising:
   a. a handle; and
   b. two pins mounted in and extending from an end of the handle in a predetermined spacing relative to each other, with each pin being dissimilar in diameter relative to the other, said spacing and diameters being identical to the spacing and diameters of holes extending through a connector and through a circuit board on which the connector is to be mounted so that upon inserting the pins through the holes in the connector and then inserting the pins into the holes on the circuit board, each lead depending from the connector is automatically in correct alignment with the proper lead-receiving hole in the circuit board into which it is to be received and which may then be inserted by pushing on the handle.

* * * * *